United States Patent [19]

Edwards

[11] 4,387,444
[45] Jun. 7, 1983

[54] NON-VOLATILE SEMICONDUCTOR MEMORY CELLS

[75] Inventor: Colin W. Edwards, Chalfont St. Peter, England

[73] Assignee: Hughes Aircraft Company, El Segundo, Calif.

[21] Appl. No.: 166,211

[22] Filed: Jul. 7, 1980

[51] Int. Cl.³ .............................................. G11C 11/40
[52] U.S. Cl. ..................................... 365/156; 365/185
[58] Field of Search ............... 365/156, 154, 181, 182, 365/184, 185, 190, 95; 307/279, 288, 291, 530

[56] References Cited

U.S. PATENT DOCUMENTS

| | | | |
|---|---|---|---|
| 4,096,398 | 6/1978 | Khaitan | 307/475 X |
| 4,132,904 | 1/1979 | Harari | 365/156 X |
| 4,175,290 | 11/1979 | Harari | 365/154 X |

FOREIGN PATENT DOCUMENTS 2000407  1/1979  United Kingdom ................. 365/156

Primary Examiner—Larry N. Anagnos
Assistant Examiner—David R. Hudspeth
Attorney, Agent, or Firm—Robert M. Wallace; William J. Bethurum; Anthony W. Karambelas

[57] ABSTRACT

Non-volatile bistable semiconductor latches having a pair of cross-coupled branches, each branch having a complementary driver or load and a driver connected in series at a respective node; at least one of the complementary drivers or loads, or drivers, includes a non-volatile IGFET having a variable threshold voltage (e.g. a FATMOS), said latch additionally including one or more buffer transistors (e.g. P-channel IGFETS) connected between one or both nodes and a latch output line. The buffer transistors increase the predictability of the state of the latch during power-on in a non-volatile mode of operation. Preferably the complementary drivers or loads, and the drivers, are constructed in CMOS or N-channel MOS. The buffers can drive a single DATA output line of twin DATA, DATA lines in a push-pull configuration.

14 Claims, 5 Drawing Figures

NON-VOLATILE SEMICONDUCTOR MEMORY CELLS

This invention relates to semiconductor memory circuits which have the capability of retaining stored information even after electrical power to the circuit has been removed.

BACKGROUND OF THE INVENTION

Semiconductor memories can be classified as volatile (where stored information is lost upon power removal) and non-volatile (where stored information is maintained after power removal, and which can be accurately retrieved upon subsequent power-up). Several types of non-volatile semiconductor memories are known, notably based on MNOS transistors, FAMOS transistors, or FATMOS transistors. A description of prior MNOS and FAMOS memory circuits is given in U.S. Pat. No. 4,132,904. The latter patent, together with U.K. Specification No. 2,000,407 describe and claim FATMOS non-volatile memory circuits.

The FATMOS is basically a control gate plus floating gate MOS transistor with a portion of the floating gate lying close to the semiconductor substrate. When the source and drain connections are connected to an appropriate potential (one positive relative to the other) and a suitable potential of a first magnitude applied to the control gate, the transistor conducts. Upon removal of the control gate potential, conduction ceases. If a potential of a secon and higher magnitude is applied to the control gate with the drain at zero voltage, the transistor again conducts, but in addition electric charges tunnel between the floating gate and the transistor substrate through the portion of the floating gate closest to the substrate. This charge remains on the floating gate even when the control gate potential is removed and increases the switching threshold of the device. This charge on the floating gate enables the transistor to be employed in a non-volatile memory, as described in U.K. Specification No. 2,000,407. The non-volatility is removed by applying between the control gate and drain a potential of approximately the second and higher potential, but of opposite sign.

In a typical example of an N-channel enhancement-type FATMOS, the area of the floating gate closest to the substrate overlies the drain of the transistor. In normal, non-volatile operation, a voltage of typically +5 to +10 volts is applied to the control gate. To operate the device as a non-volatile transistor, a voltage of typically +15 to +25 volts is applied to the control gate.

Although FATMOS transistors work well when employed in non-volatile memory cells (see U.K. Specification No. 2,000,407) they can sometimes be unpredictable during powerup after the FATMOS's have been placed in their non-volatile mode. This unpredictability manifests itself by the FATMOS transistor(s) switching to the wrong state (i.e. a FATMOS with a charge retained on its floating gate being held "off" instead of "on", and vice-versa). The explanation for this appears to arise from the processing conditions employed to produce the N+ diffusion areas. These have a higher capacitance per unit area than other semiconductor areas, and the consequence is that the device has more nodal capacity to the negative supply line than the positive line. If, for example, one examines the CMOS non-volatile memory cell illustrated in FIG. 2a of U.S. Pat. No. 4,132,904 (which employs a pair of FATMOS drivers in a cross-coupled latch configuration), the capacitance which exists between N1 and N2 to the more negative supply rail ($V_{SS}$) is greater than the corresponding capacitance to the more positive supply rail $V_{DD}$. Thus, when the cell is switched on after the FATMOS transistors ($Q_2$ and $Q_4$) have been placed in their non-volatile modes, the P-channel complementary driver or load transistors ($Q_1$ and $Q_3$) switch on faster than the FATMOS devices. They will thus make a decision regarding conduction states ahead of the FATMOS devices. The latter transistors may therefore possibly be driven into the incorrect states and are thus incapable of steering the latch into its correct, non-volatile memory state.

In addition to the above, it has also been found that when FATMOS devices are driven at high threshold (control gate) voltages, they become unpredictable as a consequence of their weaker driving capability.

The object of this invention is to improve FATMOS-containing non-volatile memory cells by increasing their reliability of action in their non-volatile modes.

SUMMARY OF THE INVENTION

The present invention reduces such unpredictability as described by employing buffer transistors in each memory circuit, whereby to add capacitance between the cell nodes and the positive supply line. This enables the FATMOS devices to turn on first and thus enables them to dictate correctly the state to which the circuit should go. The buffers also remove the problem of unpredictable action in the FATMOS devices at high threshold levels by increasing the driving capability to the output (DATA) lines of the circuit.

According to the invention there is provided a non-volatile bistable semiconductor latch having a pair of cross-coupled branches connectable across a common supply voltage, each branch including a complementary driver or load and a driver connected in series at a respective node, at least one of said complementary drivers or loads, or drivers, including an insulated gate field effect transistor (IGFET) having a variable threshold voltage whereby, when said threshold voltage is raised above a predetermined level, said transistor is rendered non-volatile to so render information held by the latch non-volatile, said latch additionally including one or more buffer transistors connected between one or both nodes and an output line of the latch.

BRIEF DESCRIPTION OF THE DRAWINGS

Preferred features of the invention will now be described, with reference to the accompanying drawings, given by way of example, wherein.

DESCRIPTION OF THE PREFERRED EMBODIMENTS

Figure 1:
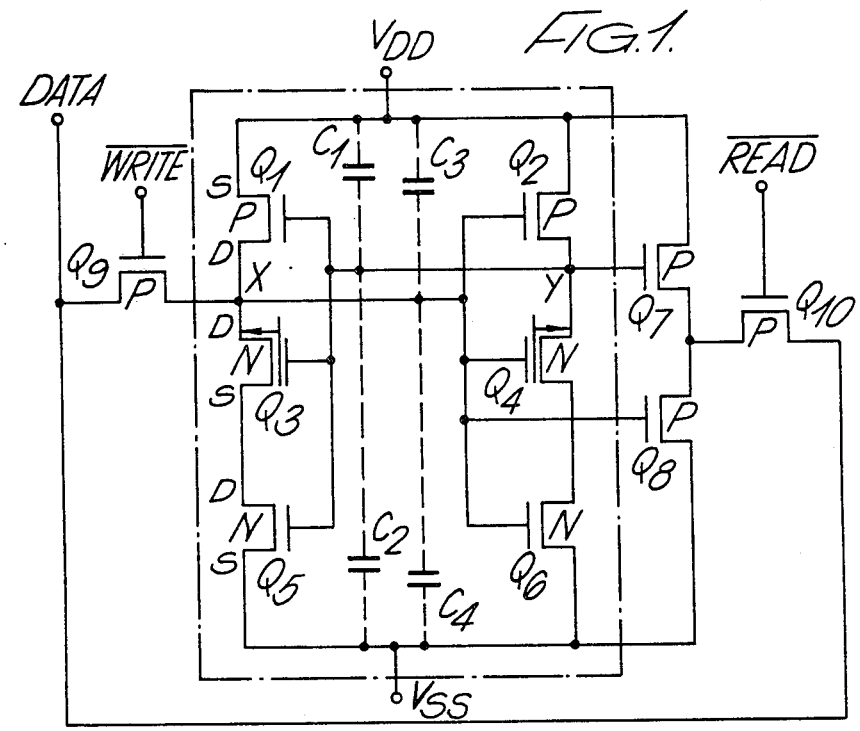
FIGS. 1 and 2 are electrical circuit diagrams of a first embodiment of the invention.
Figure 2:
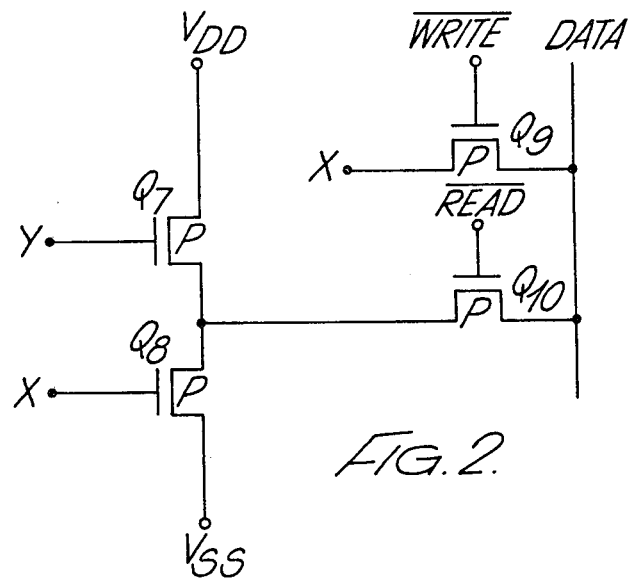

A first embodiment of the invention is illustrated in FIGS. 1 and 2.

Referring to FIG. 1, there is illustrated a CMOS NOVRAM latch having P-channel complementary drivers (or loads) $Q_1$, $Q_2$ and N-channel drivers constituted by FATMOS devices $Q_3$, $Q_4$ and MOS transistors $Q_5$, $Q_6$. The control gates of the transistors are cross-coupled to the nodes of each opposite branch of the cell, such nodes being indicated as X and Y. The notional capacitances between the nodes and the supply rails $V_{DD}$, $V_{SS}$ are indicated by dashed lines and capacitors $C_1$ to $C_4$. As so far described the cell (when coupled to N-channel READ and WRITE transistors) is identical to that illustrated in FIG. 6 of U.K. Specification No. 2,000,407, and thus a detailed description of its volatile and non-volatile operational states will not be given here—the reader being referred to said U.K. Specification for details.

Before describing the inventive aspects shown in FIGS. 1 and 2, the unpredictability of the circuit will first be explained, reference being made to that part of latch within the dotted-dashed box of FIG. 1. At power-up, in a non-volatile mode of operation, one of the FATMOS devices $Q_3$, $Q_4$ will be off and the other on as a consequence of the charge stored on the floating gate of the "on" one of the two devices. This characteristic should therefore force the latch into an unambiguous memory state which has been set previously by placing the FATMOS devices into the non-volatile conditions described. However, as has already been explained, the N+ diffusion areas have a high capacitance per unit area and thus $C_2 > C_1$ and $C_4 > C_3$. When power is applied to the cell, the P transistors $Q_1$ and $Q_2$ turn on faster than $Q_3$ to $Q_6$ and can themselves set the state of the latch ahead of conduction by the FATMOS devices. The memory state of the latch is hence dictated by the (unpredictable) states in which $Q_1$ and $Q_2$ settle, and not by the states predicted by the non-volatile charges on the FATMOS devices.

Reverting now to the full illustration in FIG. 1, this unpredictability is removed by adding P-channel buffer transistors $Q_7$, $Q_8$ between the DATA READ line and the nodes X and Y. In this manner, the control gate of $Q_7$ essentially increases the capacitance $C_1$ and the control gate of $Q_8$ increases the capacitance $C_3$. Ideally, the dimensions and characteristics of $Q_7$ and $Q_8$ are selected so that $C_1 >> C_2$ and $C_3 >> C_4$. Under such a circumstance the N-channel drivers $Q_3$ to $Q_6$ turn on before the P-channel devices $Q_1$ and $Q_2$ during power-up and thus the memory state of the cell is correctly and predictably determined by the non-volatile states of the FATMOS devices $Q_3$ and $Q_4$. The addition of the buffers also increases the driving capability of the latch and reduces the likelihood of unpredictable action when the FATMOS devices are operated at very high threshold voltages. The WRITE and READ transistors ($Q_9$ and $Q_{10}$ respectively) which couple the latch to a DATA line are also P-channel devices and are activated by negative potentials ($\overline{\text{WRITE}}$ and $\overline{\text{READ}}$) applied to their gates. By making these latter transistors as P-channel devices, they serve to further increase the capacitances $C_1$ and $C_3$ and ensure that $C_1 >> C_2$, $C_3 >> C_4$.

The circuit shown in FIG. 1 is shown in simplified form in FIG. 2, where the latch components have been omitted but with the coupling points to the latch nodes, X, Y shown.

The embodiment described in FIGS. 1 and 2 receives its input and provides its output through a single DATA line, but this is not essential. Alternative embodiments are illustrated in FIGS. 3 and 4.

Figure 3:
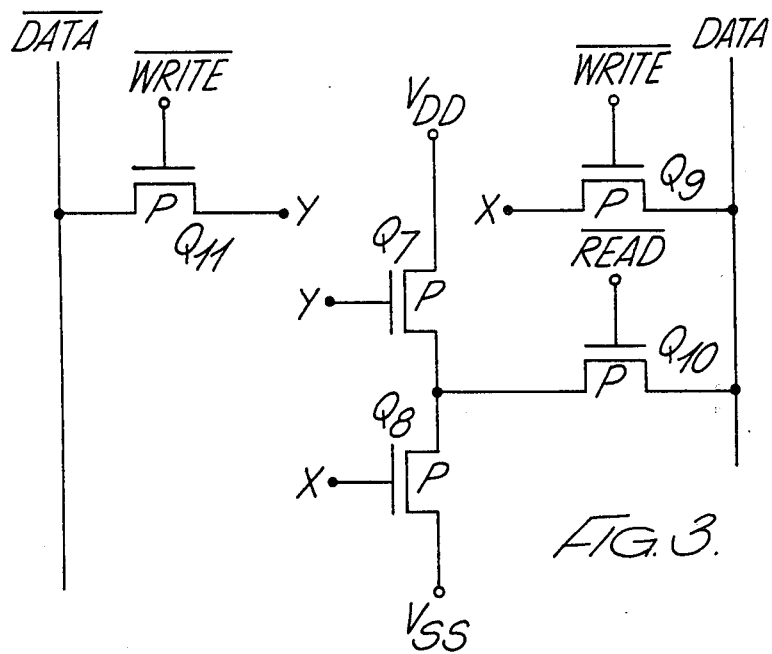
FIGS. 3 and 4 are circuit diagrams of second and third embodiments of the invention, respectively.

In FIG. 3, a push-pull WRITE input is shown from DATA and $\overline{\text{DATA}}$ lines. An additional P-channel transistor $Q_{11}$ provides the input to node Y from a $\overline{\text{DATA}}$ line.

Figure 4:
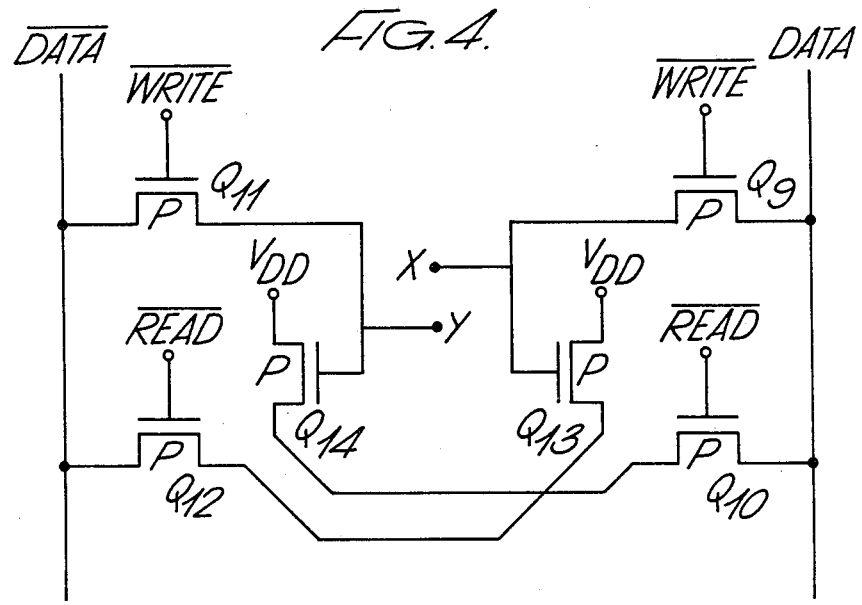

In FIG. 4, a fully symmetrical latch is shown. This has push-pull WRITE input and READ output to and from both nodes. An additional P-channel transistor $Q_{12}$ provides the READ output to the $\overline{\text{DATA}}$ line. The buffer transistors $Q_7$ and $Q_8$ of FIGS. 1 to 3 are configured slightly differently and are shown as $Q_{13}$ and $Q_{14}$, linking the X and Y nodes to the $Q_{10}$ and $Q_{12}$ READ transistors respectively. In order to enable this circuit to function adequately, the DATA and $\overline{\text{DATA}}$ lines are precharged before reading of the latch takes place. The technique of precharging data lines of RAM cells is well-known.

Figure 5:
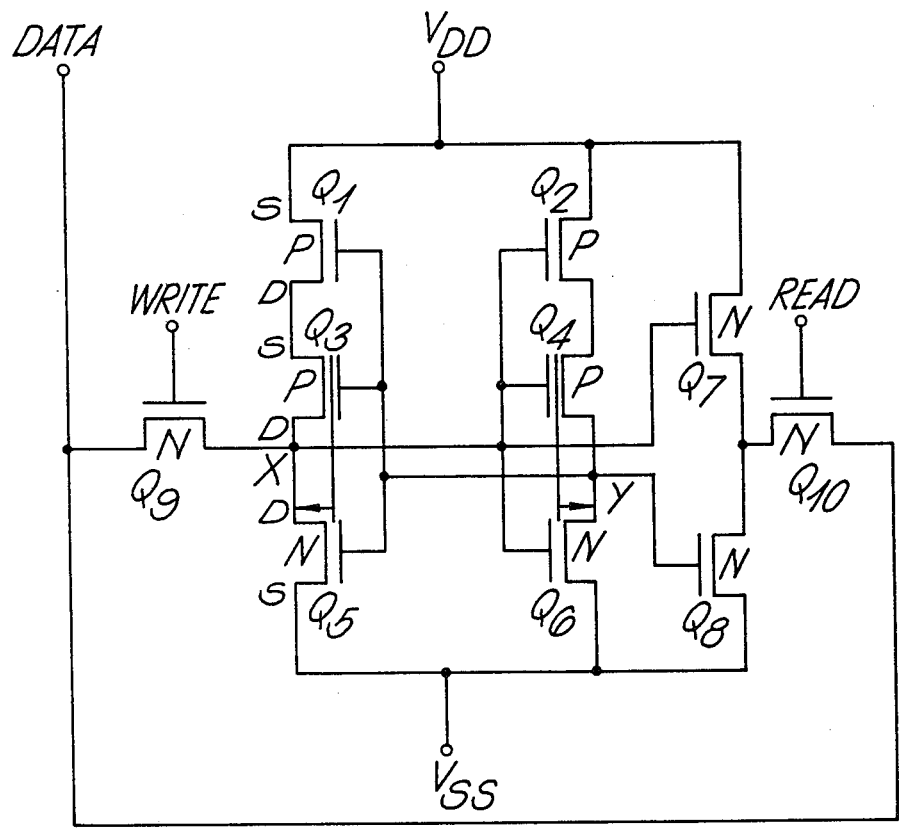
FIG. 5 is a circuit diagram of a fourth embodiment of the invention.

A further embodiment of the invention is illustrated in FIG. 5. This embodiment is a CMOS NOVRAM latch similar to that illustrated in FIGS. 1 and 2 except that P-channel rather than N-channel FATMOS devices $Q_3$, $Q_4$ are employed. The tunnels of $Q_3$ and $Q_4$ extend between their floating gates and the N+ regions of the drains of the adjacent transistors $Q_5$ and $Q_6$ respectively. The gates of the buffer transistors $Q_7$ and $Q_8$ (N-channel devices) are connected to the opposite nodes (X, Y) shown in FIG. 1 and, also, the read and write transistors $Q_9$ and $Q_{10}$ are N-channel devices.

It will be appreciated that the FIG. 5 embodiment may be further modified to include a push-pull write operation (similar to that shown in FIG. 3) or a fully-symmetrical operation (similar to that shown in FIG. 4) with appropriate substitution of N-channel for P-channel read and write transistors and reversal of node coupling to the buffer transistors where necessary.

Several further alternative circuit arrangements in accordance with the invention are possible. For example, the buffer transistors may be employed to advantage in the fully N-MOS latch illustrated in FIGS. 8 or 9 of U.K. Specification No. 2,000,407. The N-MOS transistors $Q_5$, $Q_6$ in series with the FATMOS drivers may be omitted if desired (e.g. see the circuit of FIG. 1a of U.K. Specification No. 2,000,407). Moreover, one or other of the FATMOS devices may be omitted or made to form the complementary driver(s) rather than the drivers themselves (see FIGS. 1b, 7, or 15 to 21 in U.K. Specification No. 2,000,407). The complementary driver transistors $Q_1$, $Q_2$ may be replaced by resistive loads if desired (see FIG. 10 of U.K. Specification No. 2,000,407).

I claim:

1. A non-volatile memory cell formed on a semiconductive substrate comprising a pair of branches which are connected in parallel and across the same voltage source and at least one data output node, one of said branches comprising:
   a first load transistor comprising a source, a drain, and an insulated gate;
   a first driver transistor comprising a source, a drain, an insulated floating gate, an overlying insulated control gate and including means for permitting electron tunneling between said substrate and said floating gate;
   wherein said first load transistor source and drain and said first driver transistor source and drain are connected in series combination across a voltage source to form a branch node between said first load and first driver transistors, said first load and first driver transistor gates being connected together and connected to the other of said branches;
   a first buffer transistor, said first buffer transistor comprising a source, a drain, and an insulated gate, said first buffer transistor gate connected to said branch node, one of said first buffer transistor source and drain connected to said output node and the other connected to one terminal of said voltage source;

the other of said branches comprising:
- a second load transistor comprising a source, a drain, and an insulated gate;
- a second driver transistor comprising a source, a drain, an insulated floating gate, an overlying insulated control gate and including means for permitting electron tunneling between said substrate and said floating gate;
- wherein said second load transistor source and drain and said second driver transistor source and drain are connected in series combination across said voltage source to form a second branch node between said second load and second driver transistors, said second load and second driver transistor gates being connected together and connected to said first branch node and said first load and first driver transistor gates being connected to said second branch node; and
- a second buffer transistor, said second buffer transistor comprising a source, a drain, and an insulated gate, said second buffer transistor gate connected to said second branch node and its source and drain being connected in series between the opposite terminal of said voltage source and said output node.

2. The memory cell of claim 1 wherein said first load and first driver transistors are of complementary P and N-channel conductivity types.

3. The memory cell of claim 1 wherein said first buffer transistor and said first driver transistor are of complementary P and N-channel conductivity types.

4. The memory cell of claim 1 further comprising a supplementary load transistor comprising a source, a drain and an insulated gate, said supplementary load transistor source and drain connected in series with said first load transistor source and drain and said first driver transistor source and drain.

5. The memory cell of claim 4 wherein said means for permitting electron tunneling permits electron tunneling between said floating gate and said supplementary load transistor drain.

6. The memory cell of claim 5 wherein said first load transistor and said first driver transistor are of the same channel conductivity type while said supplementary load transistor is of a complementary channel conductivity type.

7. The memory cell of claim 6 wherein said first load and first driver transistors are of P-channel conductivity type while said supplementary load transistor and said first buffer transistor are of N-channel conductivity type.

8. A non-volatile memory cell formed on a semiconductive substrate comprising a pair of branches which are connected in parallel and across the same voltage source, said memory cell comprising a data output node and a complementary data output node, one of said branches comprising:
- a first load transistor comprising a source, a drain and an insulated gate;
- a first driver transistor comprising a source, a drain, an insulated floating gate, an overlying insulated control gate and including means for permitting electron tunneling between said substrate and said floating gate;
- wherein said first load transistor source and drain and said first driver transistor source and drain are connected in series combination across a voltage source to form a branch node between said first load and first driver transistors, said first load and first driver transistor gates being connected together and connected to the other of said branches;
- a first buffer transistor, said first buffer transistor comprising a source, a drain, and an insulated gate, said first buffer transistor gate connected to said branch node, one of said first buffer transistor source and drain connected to said data output node and the other connected to one terminal of said voltage source;

the other of said branches comprising:
- a second load transistor comprising a source, a drain, and an insulated gate;
- a second driver transistor comprising a source, a drain, an insulated floating gate, an overlying insulated control gate and including means for permitting electron tunneling between said substrate and said floating gate;
- wherein said second load transistor source and drain and said second driver transistor source and drain are connected in series combination across said voltage source to form a second branch node between said second load and second driver transistors, said second load and second driver transistor gates being connected together and connected to said first branch node and said first load and first driver transistor gates being connected to said second branch node; and
- a second buffer transistor, said second buffer transistor comprising a source, a drain and an insulated gate, said second buffer transistor gate being connected to said second branch node and its source and drain connected in series between said one terminal of said voltage source and said complementary data output node.

9. The memory cell of claim 8 wherein said first load and first driver transistors are of complementary P- and N-channel conductivity types.

10. The memory cell of claim 8 wherein said first buffer transistor and said first driver transistor are of complementary P- and N-channel conductivity types.

11. The memory cell of claim 8 further comprising a supplementary load transistor comprising a source, a drain and an insulated gate, said supplementary load transistor source and drain connected in series with said first load transistor source and drain and said first driver transistor source and drain, and its gate connected to said first driver transistor gate.

12. The memory cell of claim 11 wherein said means for permitting electron tunneling permits electron tunneling between said floating gate and said supplementary load transistor drain.

13. The memory cell of claim 12 wherein said first load transistor and said first driver transistor are of the same channel conductivity type while said supplementary load transistor is of a complementary channel conductivity type.

14. The memory cell of claim 13 wherein said first load and first driver transistors are of P-channel conductivity type while said supplementary load transistor and said first buffer transistor are of N-channel conductivity type.

* * * * *